US007256619B1

(12) United States Patent
Im et al.

(10) Patent No.: US 7,256,619 B1
(45) Date of Patent: Aug. 14, 2007

(54) APPARATUS TO SHIFT TO PRE-CHARGE MODE A DYNAMIC CIRCUIT DRIVEN BY ONE-SHOT CLOCK SIGNAL DURING POWER OFF MODE

(75) Inventors: Yonghee Im, Pleasanton, CA (US); Kyung T. Lee, San Jose, CA (US); Han Bin Kim, Pleasanton, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 228 days.

(21) Appl. No.: 11/099,186

(22) Filed: Apr. 4, 2005

(51) Int. Cl.
*H03K 19/096* (2006.01)
*H03K 19/20* (2006.01)

(52) U.S. Cl. ........................ 326/95; 326/121; 365/203; 327/544

(58) Field of Classification Search .................. 326/93, 326/95, 98, 112, 119, 121; 327/544; 365/203
See application file for complete search history.

(56) References Cited

U.S. PATENT DOCUMENTS 5,453,708 A * 9/1995 Gupta et al. .................. 326/98
6,429,689 B1 * 8/2002 Allen et al. .................. 326/95
6,873,188 B2 * 3/2005 Belluomini et al. .......... 326/98
2002/0057112 A1 * 5/2002 Ye et al. ..................... 326/121

* cited by examiner

*Primary Examiner*—Daniel Chang
(74) *Attorney, Agent, or Firm*—Hickman Palermo Truong & Becker; Christopher J. Brokaw; Bobby K. Truong

(57) ABSTRACT

A method and apparatus for shifting a dynamic circuit, driven by a one-shot clock, to a pre-charge mode, during a power-off mode, is provided. Under certain conditions, a floating node may be present in a dynamic circuit. One approach to prevent floating nodes involves the generation of a new one-shot clock signal that is supplied to the last dynamic circuit in the series of dynamic circuits before the output flop ("the final dynamic circuit"). The new one-shot clock signal is driven to a logical low value when the power-off signal has a logical high value. Another approach to prevent floating nodes involves modifying the final dynamic circuit to include a structure that, when the power-off signal has a logical high value, drives the dynamic node to either a logical high value or a logical low value to prevent the dynamic node from becoming a floating node.

8 Claims, 10 Drawing Sheets

LEVEL 2
LEVEL 1
400
(2 GATE DELAY) HEADER
6 GATE DELAY
IN_BIG_D
LEVEL 2 CLOCK SIGNAL
406
LEVEL 1 CLOCK SIGNAL
1 GATE DELAY
IN_SMALL_D
404
POWER-OFF SIGNAL
IN_SMALL_D_PWR
q
NOS CLOCK SIGNAL
DYNAMIC NODE 402

480
NOS CLOCK SIGNAL 486 (=0)
482
'1'
484
OUTPUT FLOP 490
OUTPUT SIGNAL 488 (=0)
d
PDN

APPARATUS TO SHIFT TO PRE-CHARGE MODE A DYNAMIC CIRCUIT DRIVEN BY ONE-SHOT CLOCK SIGNAL DURING POWER OFF MODE

BACKGROUND

A circuit may be categorized as being a static circuit or a dynamic circuit. A static circuit is a circuit whose output is not triggered by a clock signal. On the other hand, a dynamic circuit is a circuit whose output is triggered by a clock signal. An advantage of dynamic circuits is that they typically operate faster than static circuits.

Since the output of a dynamic circuit is triggered by a clock signal, a dynamic circuit operates in two different modes, namely an evaluation mode and a pre-charge mode, depending on whether the value of the clock signal is a logical high (in other words, a “1”) or a logical low (in other words, a “0”).

When the clock signal applied to the dynamic circuit has a logical high value, the dynamic circuit is in evaluation mode. In evaluation mode, the logic of the dynamic circuit is evaluated using the inputs to the dynamic circuit. Thus, when a dynamic circuit is in evaluation mode, the output of the dynamic circuit depends upon the evaluation of the logic of the dynamic circuit using the inputs applied to the dynamic circuit.

When the clock signal applied to the dynamic circuit has a logical low value, the dynamic circuit is in pre-charge mode. In pre-charge mode, the logic of the dynamic circuit is not evaluated. The output of a dynamic circuit in pre-charge mode is driven to a logical low value, since the logic of the dynamic circuit is not being evaluated.

FIG. 1 is a diagram illustrating the output signal of a dynamic circuit in both evaluation mode and pre-charge mode. As FIG. 1 illustrates, the rising edge of the clock signal causes the dynamic circuit to be in evaluation mode, while the falling edge of the clock signal causes the dynamic circuit to be in pre-charge mode. Thus, the evaluation of the logic of a dynamic circuit, using the applied inputs, is triggered by the rising edge of the clock, and the output of the dynamic circuit is driven to a logical low at the falling edge of the clock.

A dynamic circuit may be used in conjunction with an input flop and an output flop. A flop (alternately called a “flip-flop”) is a type of circuit that will maintain its state indefinitely until it receives an input signal, called a trigger, which forces the flop to alternate its state. Once the flop changes state it remains in that state until another trigger is received. A flop may be used to store data. A flop that provides a set of inputs to a dynamic circuit is referred to as an input flop, while a flop that stores a set of outputs from a dynamic circuit is referred to as an output flop.

FIG. 2A is a diagram illustrating a dynamic circuit 204 in conjunction with an input flop 202 and an output flop 206. As shown in FIG. 2A, at the rising edge of the clock signal, the input flop 202 provides a set of input to the dynamic circuit 204. At the rising edge of the clock signal, the dynamic circuit 204 is in evaluation mode. When the dynamic circuit 204 is in evaluation mode, the logic of the dynamic circuit 204 is evaluated, using the input from the input flop 202, to produce a set of output. Also at the next rising edge of the clock, the output flop 206 reads and stores the output from the dynamic circuit 204.

Dynamic circuits may be arranged in a series of two or more dynamic circuits. When multiple dynamic circuits are arranged in a series, the output of one dynamic circuit is the input to the next dynamic circuit in sequence. FIG. 2B is a diagram illustrating a circuit 210 that comprises series of three dynamic circuits (named A, B, and C) in conjunction with an input flop and an output flop. As FIG. 2B illustrates, the output of the input flop is the input to dynamic circuit A, the output of dynamic circuit A is the input to dynamic circuit B, and so on.

FIG. 2B also illustrates a timing diagram 212 of the signals of circuit 210. The rising edge of the clock signal triggers each dynamic circuit of circuit 210 to enter evaluation mode contemporaneously. For example, as the timing diagram 212 shows, the rising edge of the clock causes: (1) the input flop to produce data on signal d as output, (2) dynamic circuit A to evaluate its logic using the data signal d as input to produce data on signal q1 as output, (3) dynamic circuit B to evaluate its logic using data on signal q1 as input to produce data on signal q2 as output, and (4) dynamic circuit C to evaluate its logic using data on signal q2 as input to produce data on signal q3 as output.

A problem with storing data, produced by dynamic circuit C, in the output flop may be encountered. The output flop reads the value of signal q3 at the rising edge of the clock. As the timing diagram 212 shows, because of the delays in evaluating the logic of dynamic circuits A, B, and C, when the output flop reads the value of q3, dynamic circuit C has not yet generated an output on signal q3. Also, shortly after the time that dynamic circuit C does produce an output on signal q3, the falling edge of the clock causes dynamic circuit C to enter pre-charge mode, which, in turn, causes dynamic circuit C to output a logical low value on signal q3.

As a result, when the output flop reads the value of signal q3, the value of signal q3 has been driven to a logical low by the prior falling edge of the clock. In effect, the data produced by dynamic circuit C is passing by the output flop without the output flop being able to read the data. Thus, the output flop will never be able to read the output value of dynamic circuit C, and the value of signal q produced by the output flop will always be a logical low, as shown in timing diagram 212.

To solve this problem, a one-shot clock signal may be applied to the last dynamic circuit in the series, e.g., in this case, a one-shot clock signal is applied to dynamic circuit C. A one-shot clock signal is a clock signal that extends the period of time in which the dynamic circuit receiving the one-shot clock signal stays in evaluation mode. In this way, the length of time that the output of dynamic circuit C is available to be read on signal q3 is extended. Thus, the output flop may read the output produced by dynamic circuit C on signal q3 at the next rising edge of the clock signal.

To illustrate this technique, consider FIG. 2C, which is a diagram illustrating a circuit 220, similar to that shown in FIG. 2B, except that a one-shot clock signal is applied to dynamic circuit C in FIG. 2C. FIG. 2C also shows a timing diagram 222 of the circuit 220 shown in FIG. 2C. As shown in the timing diagram 222, the length of time that the data produced by dynamic circuit C on signal q3 is available to be read by the output flop is extended since the one-shot clock signal is applied to dynamic circuit C. Thus, the output flop may read the output produced by dynamic circuit C in signal q3 at the next rising edge of the clock. In this way, signal q produced by the output flop reflects the evaluation of the series of dynamic circuits A, B, and C, instead of always being driven to a logical low value as is the case in FIG. 2B.

On occasion, it has been observed that a set of circuits containing a dynamic circuit receiving a one-shot clock signal may not behave as intended. It is desirable to ensure that circuits behave as intended. Consequently, an approach for ensuring the proper behavior of circuits is desirable.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY

Embodiments of the invention operate under the recognition that a floating node may be present in a dynamic circuit when (a) a power-off signal, applied to the dynamic circuit, has a logical high value and (b) a one-shot clock signal, also applied to the dynamic circuit, has a logical high value.

The value of the power-off signal, applied to a dynamic circuit, affects the PDN (Pull Down Network) of the dynamic circuit. When the power-off signal has a logical high value, the PDN is turned off. As a result, a dynamic node of the dynamic circuit is not driven to a logical low value when the power-off has a logical high value. When the one-shot clock signal has a logical high value, the dynamic node is also not driven to a logical high value. Thus, when (a) the power-off signal has a logical high value, and (b) the one-shot clock signal has a logical high value, nothing is driving the dynamic node, and the dynamic node becomes a floating node.

According to one embodiment of the invention, a new one-shot clock signal (abbreviated as a NOS clock signal) is generated. The NOS clock signal is supplied to the last dynamic circuit in the series of dynamic circuits before the output flop ("the final dynamic circuit"). The NOS clock signal is driven to a logical low value when the power-off signal has a logical high value. Since the last dynamic circuit is in pre-charge mode when the power-off signal has a logical high value, the dynamic node is driven to a logical high value, thereby preventing the dynamic node of the final dynamic circuit from becoming a floating node.

According to another embodiment of the invention, a structure is added to the final dynamic circuit which, when the power-off signal has a logical high value, drives the dynamic node to either a logical high value or a logical low value to prevent the dynamic node from becoming a floating node. To illustrate, a PMOS transistor, whose input is the power-off signal, may be connected to the dynamic node. In this way, when the power-off signal is a logical high value, the dynamic node will be driven to a logical high value, thereby preventing the dynamic node of the final dynamic circuit from becoming a floating node.

BRIEF DESCRIPTION OF THE DRAWINGS

Embodiments of the present invention are illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Embodiments of the invention discussed herein advantageously prevent a node in a circuit from floating when a power-off signal, applied to the circuit, has a logical high value. A power-off signal is a signal that may be applied to a circuit to turn off the circuit to conserve power. Typically, when a power-off signal, applied to a portion of a circuit, has a logical high value, that portion of the circuit is shut down. Some portions of a circuit may be applied with a power-off signal that has a logical high value, while other portions of the same circuit may not. Consequently, when a power-off signal has a logical high value, some portions of a circuit may be turned off (those portions of the circuit where the power-off signal is an input), while other portions of the same circuit may remain active (those portions of the circuit where the power-off signal is not an input).

Throughout the explanation herein, circuit signals may be discussed as having or driven to a logical high value or a logical low value. A signal having a logical high value is a signal that has a voltage associated with Vcc. A signal having a logical low value is a signal that has a voltage associated with ground.

Conceptual Overview

Figure 3A:
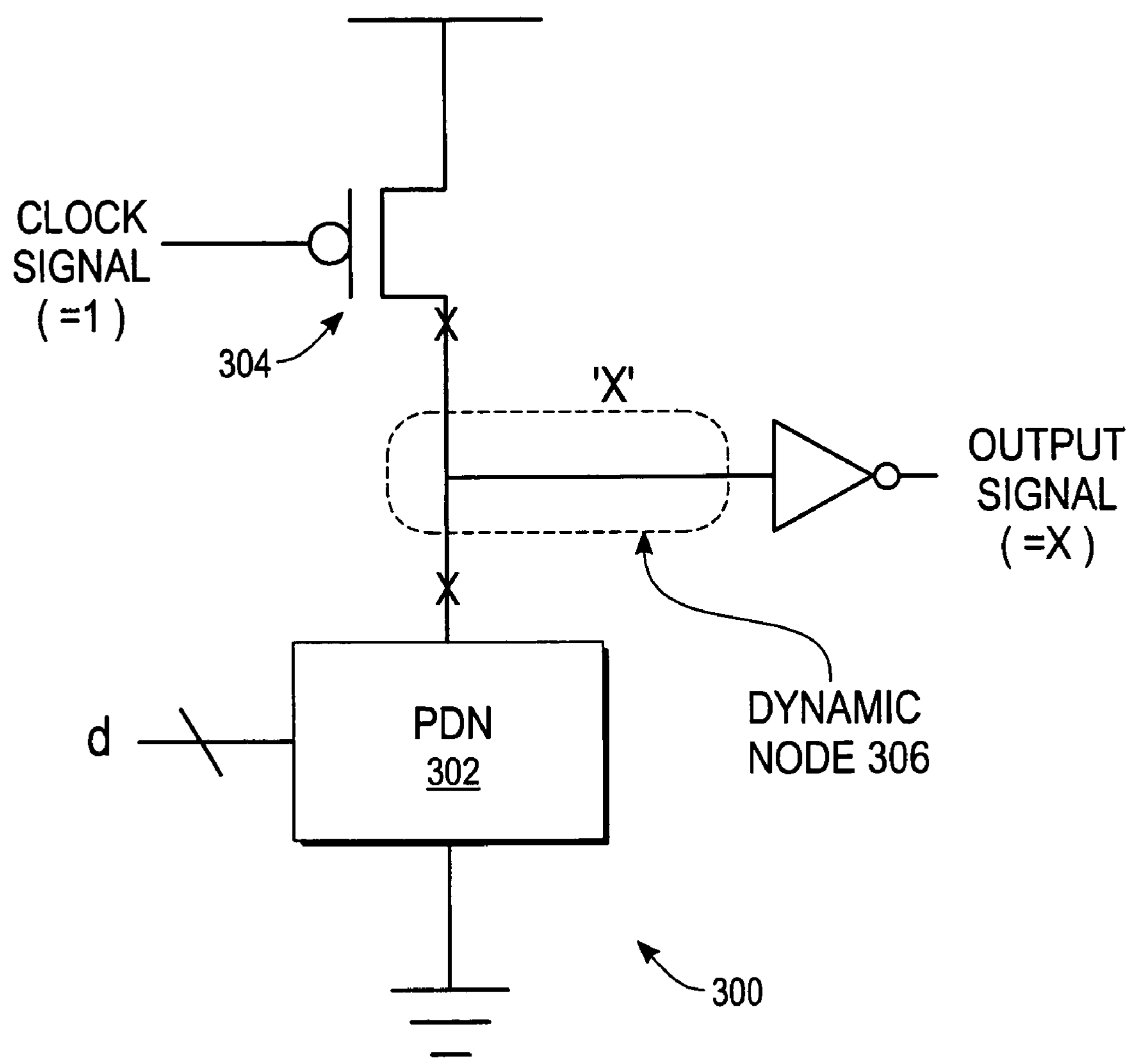
FIG. 3A is a diagram illustrating a dynamic circuit to which (a) a power-off signal is applied and (b) a one-shot clock signal is also applied.

Embodiments of the invention operate under the recognition that a floating node may be present in a dynamic circuit when (a) a power-off signal, applied to the dynamic circuit, has a logical high value and (b) a one-shot clock signal, also applied to the dynamic circuit, has a logical high value. FIG. 3A is a diagram of a dynamic circuit 300 to which (a) a power-off signal is applied and (b) a one-shot clock signal is also applied. The dynamic node 306 of the dynamic circuit 300 of FIG. 3A may be a floating node under certain conditions as described below.

The value of the power-off signal, applied to the dynamic circuit 300 of FIG. 3A, affects the PDN (Pull Down Network) 302. A PDN 302 is a series of one or more NMOS transistors that implement the set of logic that the dynamic circuit comprising the PDN 302 is intended to evaluate. When the power-off signal has a logical high value, the PDN 302 is turned off. As a result, the dynamic node 306 is not driven to a logical low value when the power-off has a logical high value.

Figure 3B:
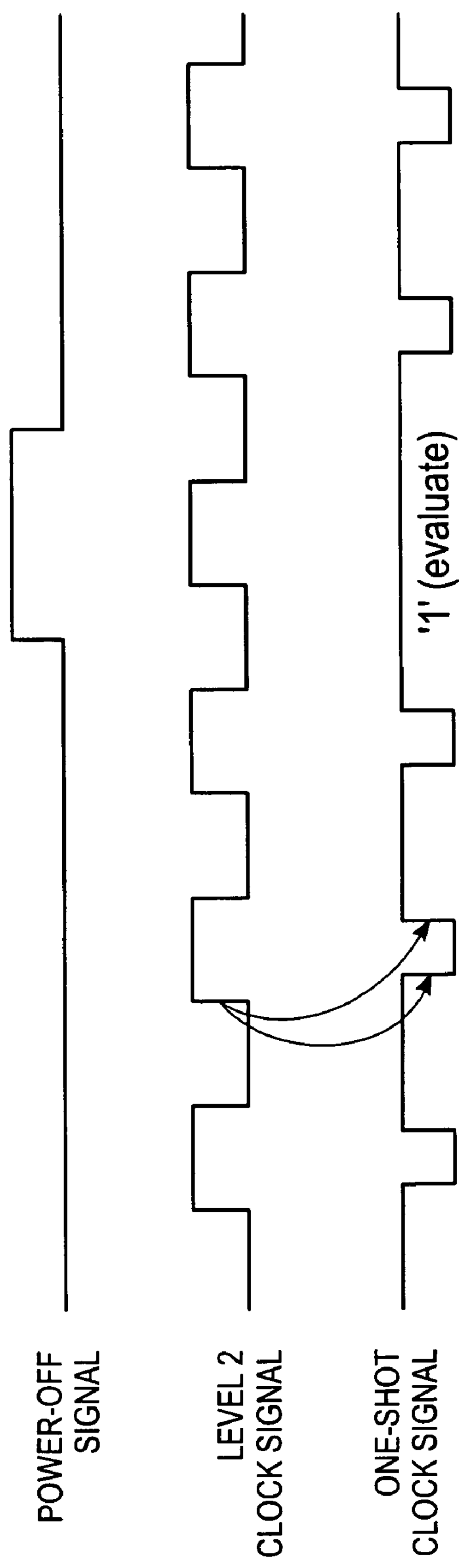
FIG. 3B is a timing diagram of a typical one-shot clock according to prior approaches.

When the one-shot clock signal has a logical high value, transistor 304 is turned off. Thus, when the one-shot clock pulse has a logical high value, the dynamic node 306 is not driven to a logical high value. For example, consider FIG. 3B, which is a timing diagram of a typical one-shot clock according to prior approaches. As FIG. 3B shows, when the power-off signal has a logical high value, a typical one-shot clock signal is driven to a logical high value. When the one-shot clock signal, having a logical high value, is applied to transistor 304 of FIG. 3A, the transistor is turned off, thereby causing dynamic node 306 to not be driven to a logical high value.

Thus, when the power-off signal has a logical high value (which in turn drives the one-shot clock signal to a logical high value), nothing is driving the dynamic node 306 of the final dynamic circuit. Since, under these conditions, the dynamic node 306 is neither driven to a logical low value nor a logical high value, dynamic node 306 is a floating node (in other words, dynamic node 306 may have a logical high value, a logical low value, or neither a logical high value nor a logical low value).

The existence of a floating node within a circuit is an undesirable condition. Since the value of the floating node may be any value, the value of the floating node is unknown. Since nothing is driving a floating node, floating nodes are vulnerable to outside noise, which may cause them to undesirably drift to having a logical high value, a logical low value, or a value that is neither a logical high value nor a logical low value. As a result, when a floating node is evaluated by the logic implemented by surrounding circuitry, unintended behavior may result. For example, the floating node may cause a circuit to become "stuck," or become unable to exit an unintended operational state, or the floating node may cause an error in evaluating the logic of the circuit containing the floating node.

Figure 1:
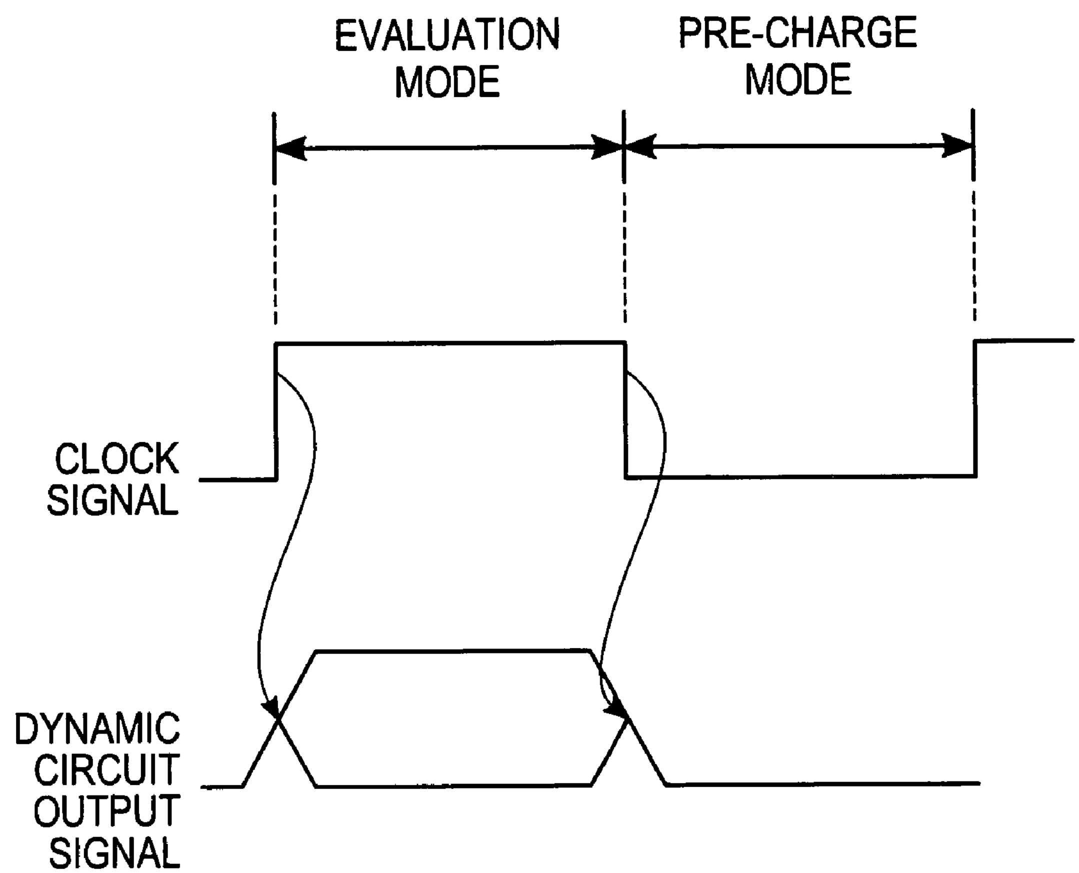
FIG. 1 is a diagram illustrating the output signal of a dynamic circuit in both evaluation mode and pre-charge mode.
Figure 2A:
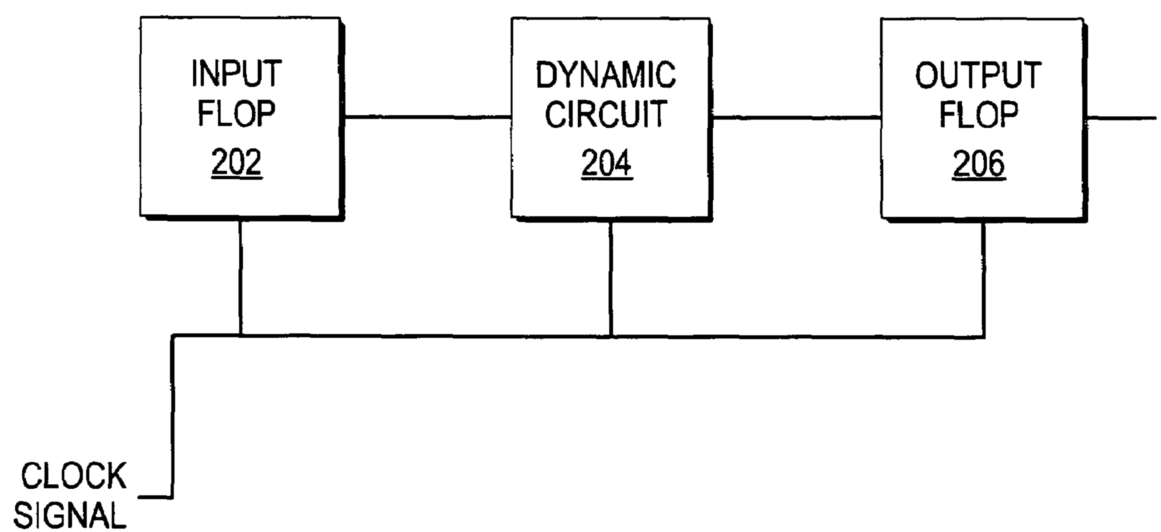
FIG. 2A is a diagram illustrating a dynamic circuit in conjunction with an input flop and an output flop.
Figure 2B:
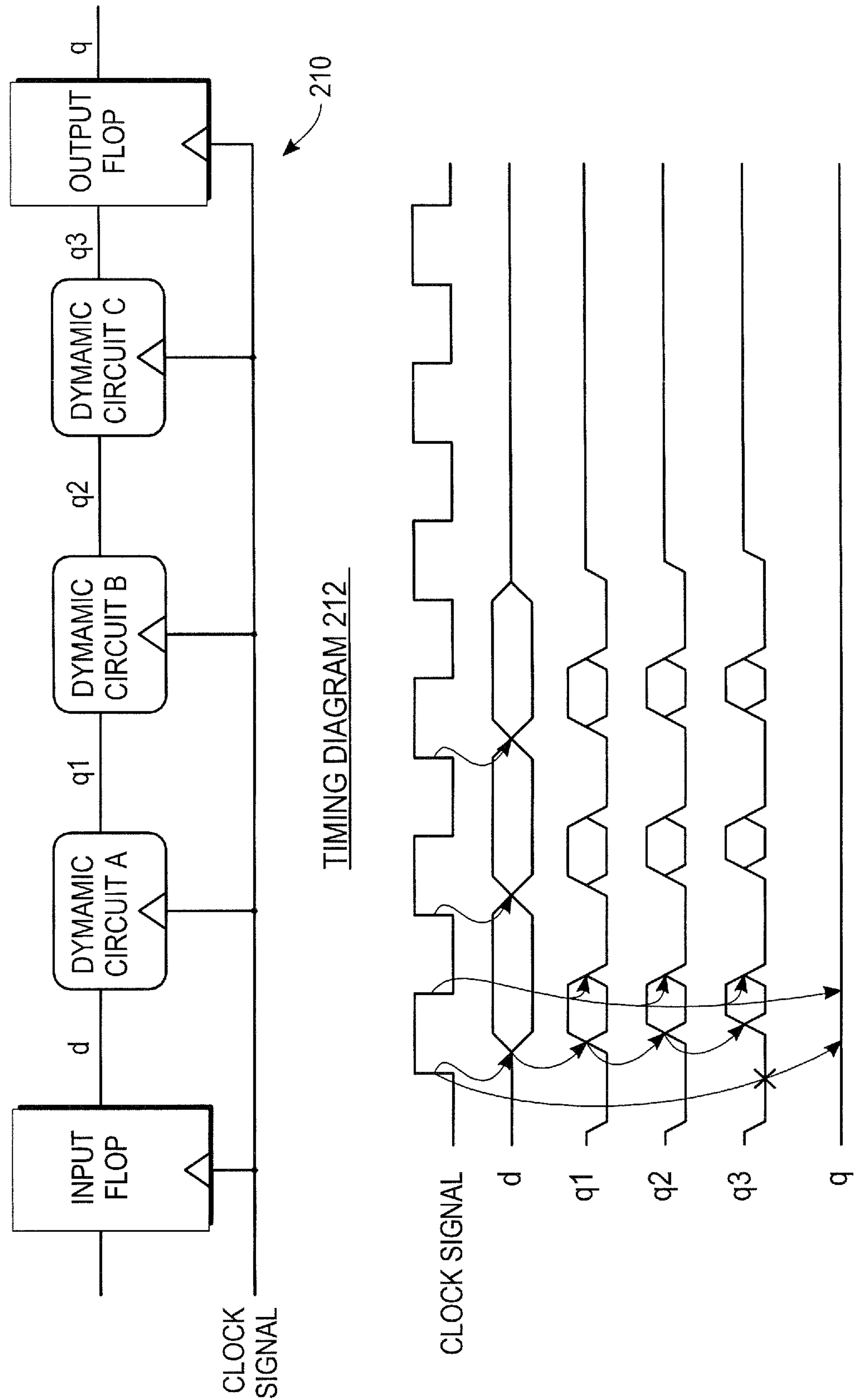
FIG. 2B is a diagram illustrating a circuit that comprises series of three dynamic circuits in conjunction with an input flop and an output flop.
Figure 2C:
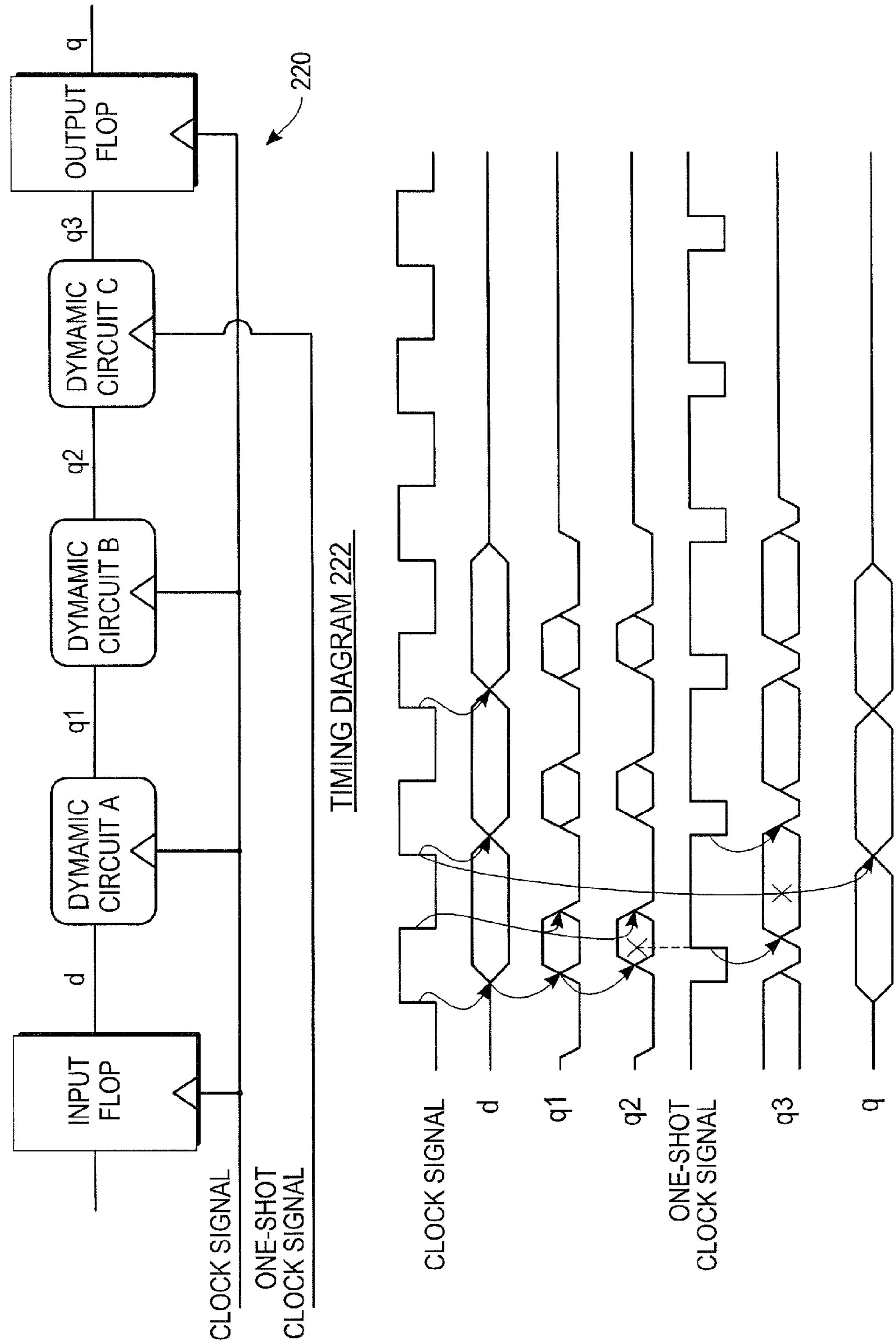
FIG. 2C is a diagram illustrating a circuit, similar to that shown in FIG. 2B, except that a one-shot clock signal is applied to dynamic circuit C in FIG. 2C.

One embodiment of the invention, used to prevent the floating node problem discussed above, involves the generation of a different type of one-shot clock pulse, referred to herein as a "new one-shot clock signal" (abbreviated as a NOS clock signal). The NOS clock signal is supplied to the last dynamic circuit in the series of dynamic circuits before the output flop ("the final dynamic circuit"). For example, in FIG. 2C, the final dynamic circuit is dynamic circuit C, since dynamic circuit C is the last dynamic circuit in the series of dynamic circuits before the output flop.

The NOS clock signal is driven to a logical low value when the power-off signal has a logical high value. Since the NOS clock signal has a logical low value when the power-off signal has a logical high value, the NOS clock signal causes the last dynamic circuit to enter pre-charge mode when the power-off signal has a logical high value. Since the last dynamic circuit is in pre-charge mode when the power-off signal has a logical high value, the dynamic node is driven to a logical high value, thereby preventing the dynamic node of the final dynamic circuit from becoming a floating node.

Another embodiment of the invention, used to prevent the floating node problem discussed above, involves modifying the final dynamic circuit. A structure may be added to the final dynamic circuit which, when the power-off signal has a logical high value, drives the dynamic node to either a logical high value or a logical low value to prevent the dynamic node from becoming a floating node. To illustrate, a PMOS transistor, whose input is the power-off signal, may be connected to the dynamic node. In this way, when the power-off signal is a logical high value, the dynamic node will be driven to a logical high value, thereby preventing the dynamic node of the final dynamic circuit from becoming a floating node.

Advantageously, by avoiding the existence of floating nodes within dynamic circuits, the embodiments of the invention discussed herein enjoy dynamic circuits that are free of computational errors in their operational behavior when the power-off signal, applied to the dynamic circuits, is driven to a logical high value. Various embodiments of the invention, each capable of achieving these advantages, shall be discussed below.

Generating a One-Shot Clock Signal that is Driven Low when the Power-Off Signal is High According to one embodiment of the invention, a "new one-shot clock signal" (abbreviated as a NOS clock signal) is applied to the final dynamic circuit to prevent a floating node from occurring in the final dynamic circuit. For example, the NOS clock signal may be applied to dynamic node C of FIG. 2C to prevent dynamic node C from containing a floating node.

Figure 4A:
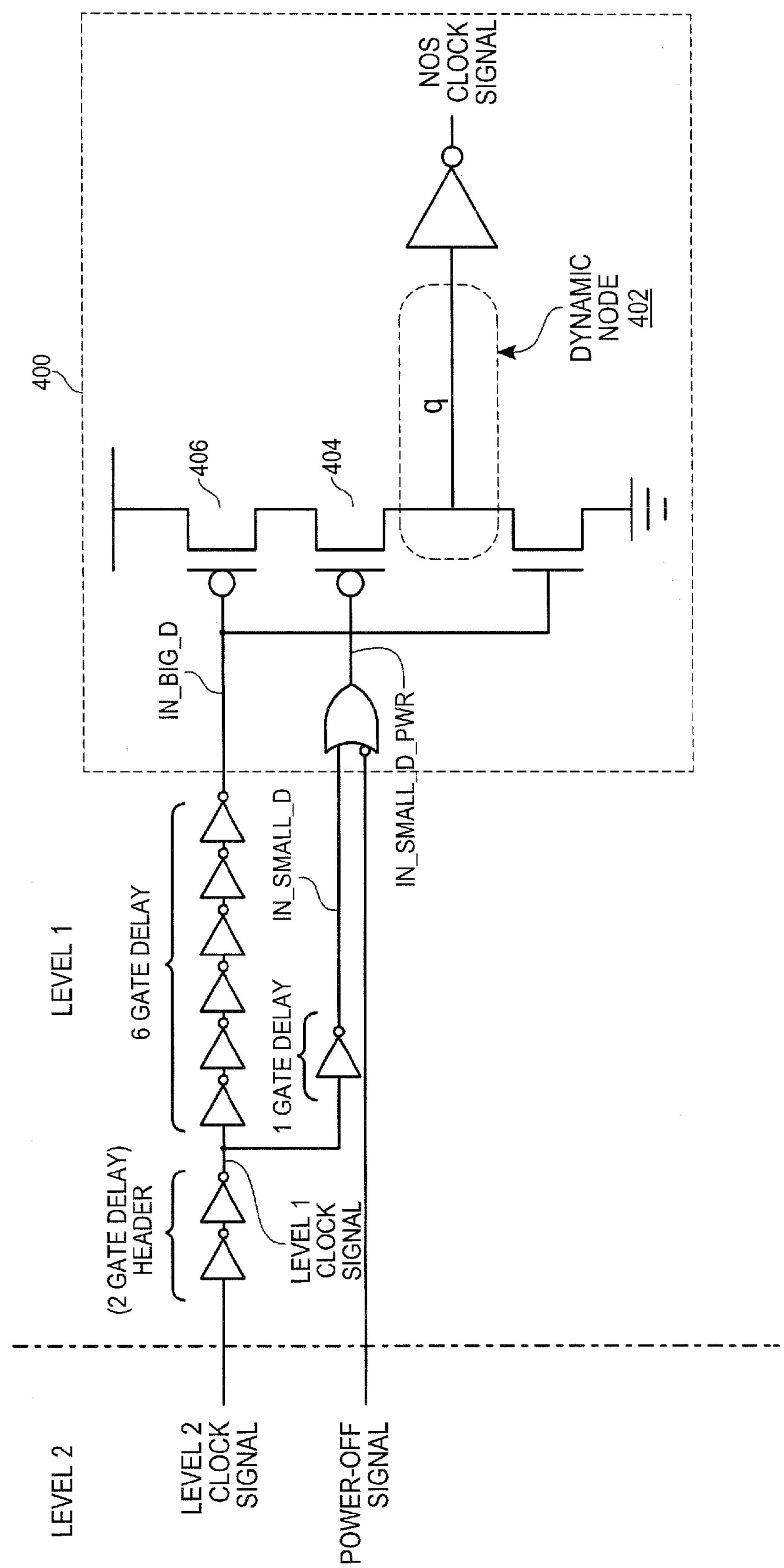
FIG. 4A is a diagram illustrating a clock circuit that is configured to generate a NOS clock signal according to an embodiment of the invention.
Figure 4B:
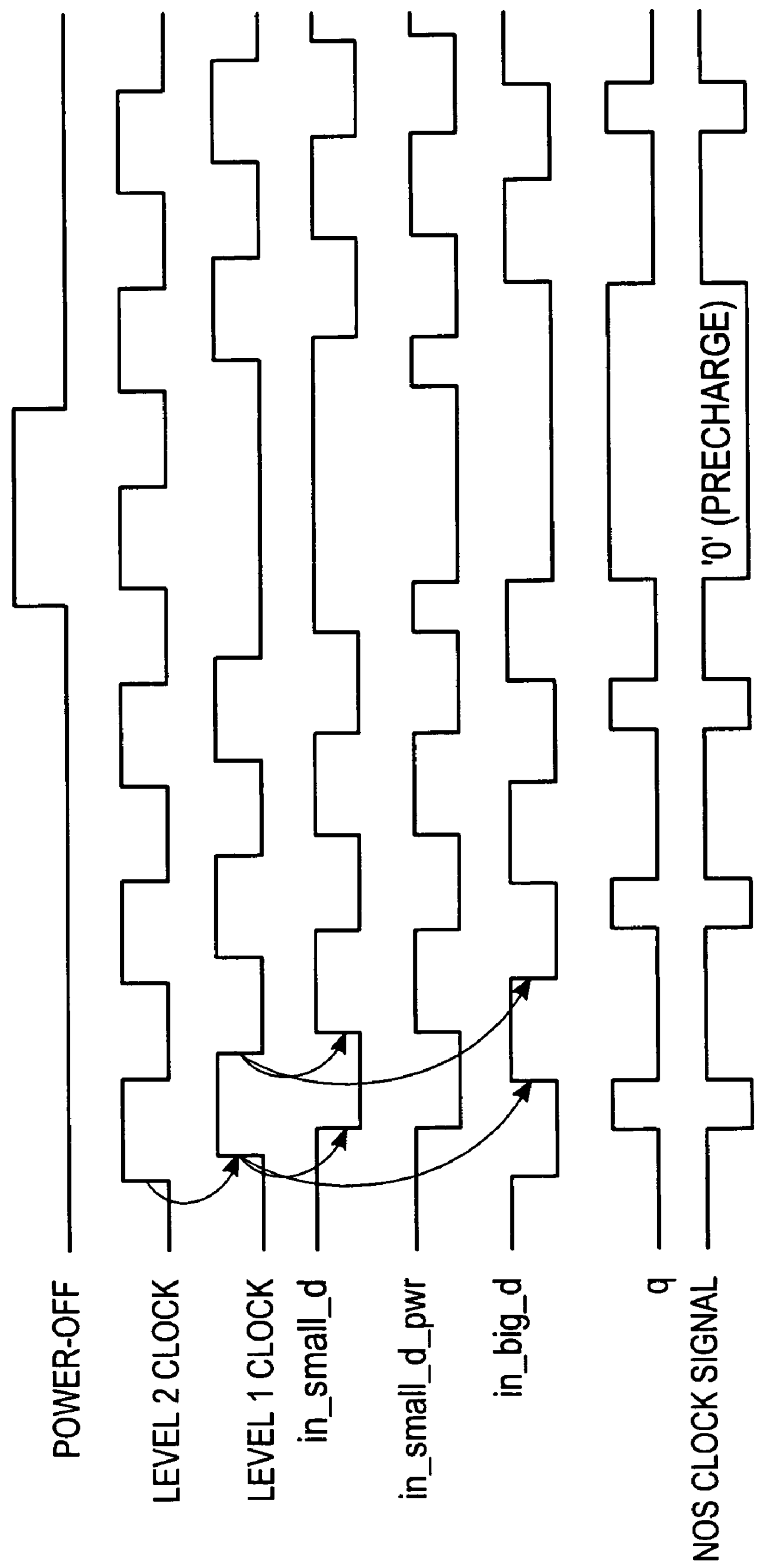
FIG. 4B is a timing diagram of the signals illustrated in FIG. 4A according to an embodiment of the invention.

FIG. 4A is a diagram of a clock circuit 400 that is configured to generate a NOS clock signal according to an embodiment of the invention. FIG. 4B is a timing diagram of the signals illustrated in FIG. 4A according to an embodiment of the invention.

As FIG. 4A illustrates, the clock circuit 400 of FIG. 4A has three inputs, namely (a) the in_big_d signal, (b) the in_small_d signal, and (c) the power-off signal. To describe the in_big_d signal and the in_small_d signal, it may be helpful to briefly describe circuit levels.

Circuitry may be organized into one or more levels. Each level of the circuitry performs functions at a certain level of granularity. When a clock signal is propagated from higher circuit level to a lower circuit level, the clock signal may be delayed to buffer the clock signal and to provide the necessary current to drive circuits of the lower circuit level.

For example, as FIG. 4A shows, the level 2 clock signal (or L2 clock signal) is delayed by two inverter gates (referred to those in the art as a "header") to obtain the level 1 clock signal (or L1 clock signal). In turn, the L1 clock signal is delayed by one inverter gate to produce the in_small_d signal, and the L1 clock signal is delayed by six inverter gates to produce the in_big_d signal. Thus, the in_small_d signal is a delayed (one gate) and inverted version of the L1 clock, and the in_big_d is a delayed (six gates) version of the L1 clock. Similarly, the in_small_d signal is a delayed (three gates) and inverted version of the L2 clock, and the in_big_d is a delayed (eight gates) version of the L2 clock.

In an actual implementation, the levels illustrated in FIG. 4A may actually correspond to higher levels than those depicted, e.g., level 2 of FIG. 4A may correspond to level 5 of a circuit, and level 1 of FIG. 4A may correspond to level 4 of the circuit. Thus, in understanding how the in_small_d signal and in_big_d signal are generated, what is important is that the in_small_d signal and in_big_d signal are produced by delaying (and in the case of in_small_d additionally inverting) the clock signal of whichever circuit level the in_small_d signal and the in_big_d signal are in.

The power-off signal, as explained above, refers to a signal that may be applied to a circuit level to turn off circuits of the circuit level to conserve power. When the power-off signal is applied to a particular circuit level with a logical high value, clock signals in that circuit level are not produced. For example, as FIG. 4B shows, when the power-off signal has a logical high value, the in_small_d signal and the in_big_d signal are not produced. In order the avoid obscuring the teachings of embodiments of the invention, the circuitry to cease producing the in_small_d signal and the in_big_d signal when an applied power-off signal has a logical high value is not shown in FIG. 4A.

Having described the inputs to the clock circuit 400 of FIG. 4A, the structure of the clock circuit 400 will now be explained. As the clock circuit 400 in FIG. 4A illustrates, a Boolean AND operation is performed on an inverted version of the power-off signal and the in_small_d signal to obtain the in_small_d_pwr signal. The dynamic node 402 of the clock circuit 400 is connected to Vcc by transistor 404 and transistor 406. The in_small_d_pwr signal is the input to transistor 404. The in_big_d signal is the input to transistor 406. Transistor 404 and 406 may each be a PMOS transistor.

The timing diagram of FIG. 4B illustrates the signals produced by the clock circuit of FIG. 4A. Importantly, when the power-off signal has a logical high value, the NOS clock signal is driven to a logical low value.

Figure 4C:
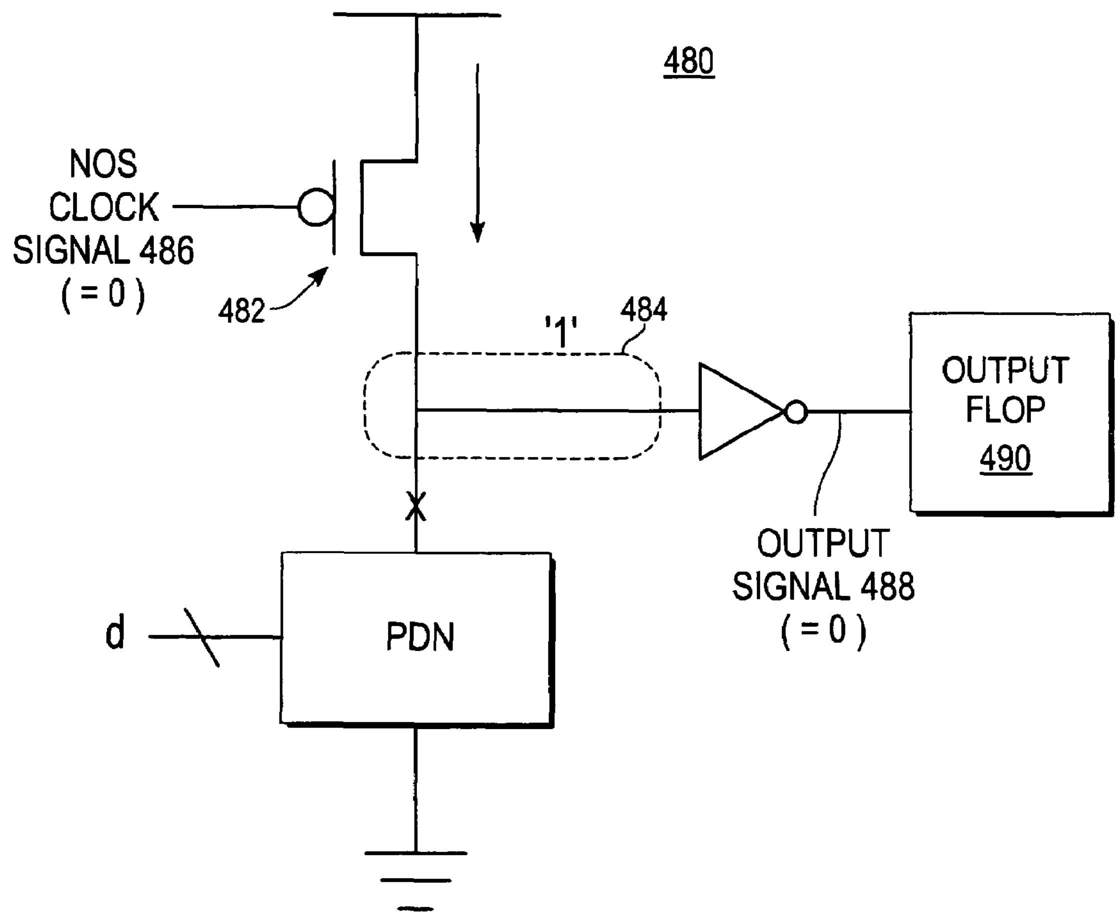
FIG. 4C is a diagram illustrating a final dynamic circuit to which the NOS clock signal is applied according to an embodiment of the invention.

Advantageously, when the NOS clock signal generated by the clock circuit 400 of FIG. 4A is applied to a final dynamic circuit, the final dynamic circuit does not develop a floating node when the power-off signal has a logical high value. To illustrate, FIG. 4C is a diagram illustrating a final dynamic circuit 480 receiving a NOS clock signal 486 according to an embodiment of the invention. As shown in FIG. 4C, when the power-off signal has a logical high value, then the NOS clock signal 486 is driven to a logical low value. As a result, transistor 482 is turned on, which drives dynamic node 484 to a logical high value. Thus, when the power-off signal has a logical high value, dynamic node 484 does not float.

Also, since the NOS clock signal 486 is a one-shot clock signal, the length of time that the output data produced by the final dynamic circuit 480 is available to be read on output signal 488 by the output flop 490 is extended, over a normal clock signal, since the NOS clock signal 486 is applied to the final dynamic circuit 480. Thus, the NOS clock signal 486 retains the advantages of a normal one-shot clock signal in addition to preventing a floating node to form in the dynamic node 484 of a dynamic circuit when the power-off signal has a logical high value.

Modifying a Dynamic Circuit the Prevent a Floating Node

Figure 5:
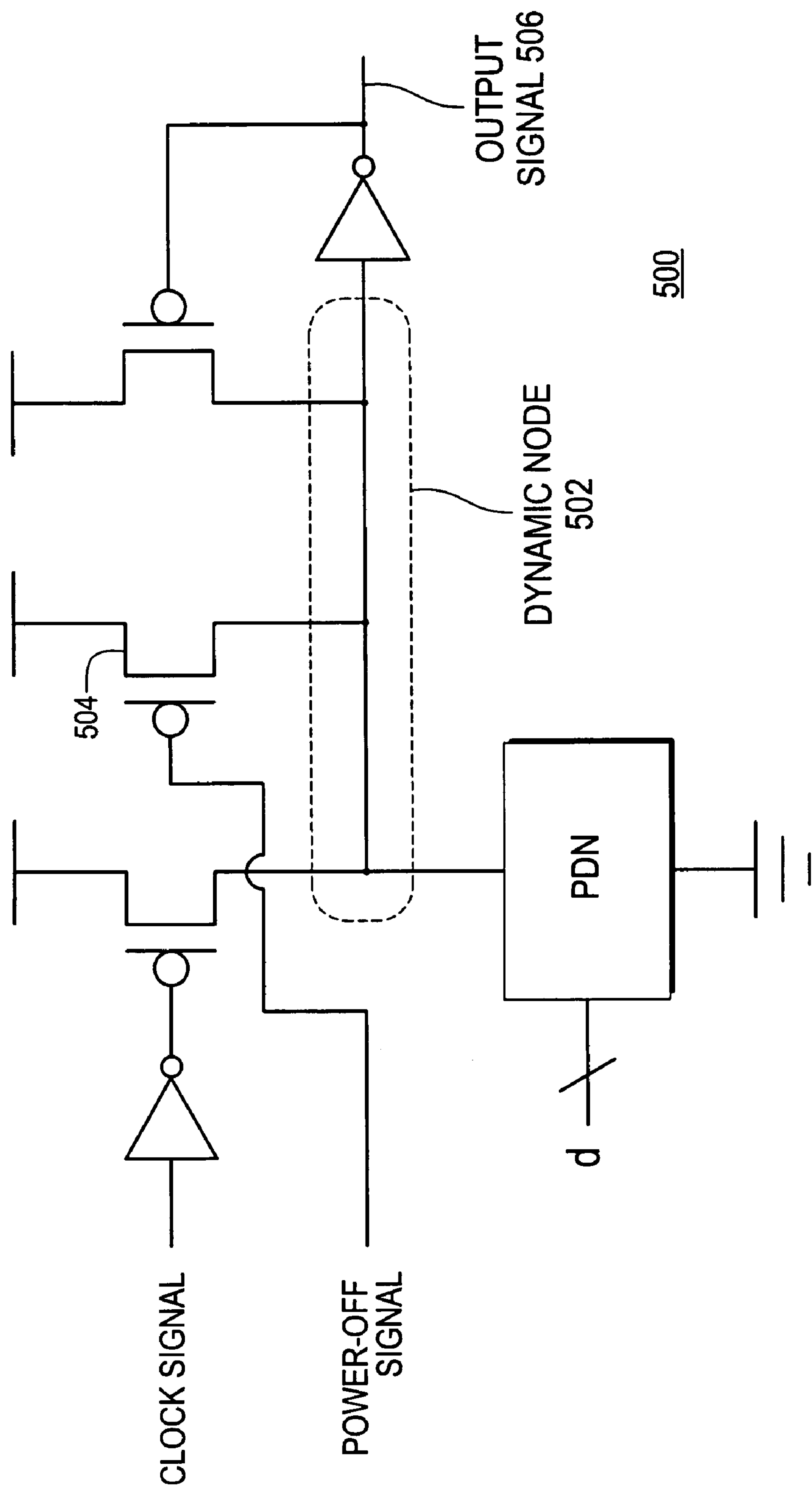
FIG. 5 is a diagram illustrating a final dynamic circuit that is configured to prevent a dynamic node of the final dynamic circuit to float according to an embodiment of the invention.

According to another embodiment of the invention, the floating node problem discussed above may be prevented by modifying the final dynamic circuit. FIG. 5 is a diagram illustrating a final dynamic circuit 500 that is configured to prevent a dynamic node 502 of the final dynamic circuit 500 to float according to an embodiment of the invention.

In order to prevent the dynamic node of the final dynamic circuit from floating when (a) a power-off signal, applied to the dynamic circuit, has a logical high value and (b) a one-shot clock signal, also applied to the dynamic circuit, has a logical high value, a structure may be added to the final dynamic circuit which, when the power-off signal has a logical high value, drives the dynamic node of the final dynamic circuit to have either a logical high value or a logical low value to prevent the dynamic node from becoming a floating node.

For example, in the embodiment of the invention depicted in FIG. 5, a PMOS transistor 504, whose input is the power-off signal, may be connected to the dynamic node 502. In this way, when the power-off signal is a logical high, the dynamic node will be driven to a logical high, thereby preventing the dynamic node of the final dynamic circuit from becoming a floating node.

The PMOS transistor 504 of FIG. 5 may be useful in any dynamic circuit, in any context, that receives a one-shot clock signal, to prevent the dynamic node of the dynamic circuit from becoming a floating node.

As FIG. 5 illustrates, the output signal 506 of the dynamic circuit 500 is driven to a logical low value when the dynamic node 504 has a logical high value.

Advantageously, the embodiments of the invention discussed above enjoy dynamic circuits that are free of floating nodes when the power-off signal, applied to the dynamic circuits, is driven to a logical high value.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. An apparatus, comprising:

a dynamic circuit driven by a one-shot clock signal to operate in either a pre-charge mode or an evaluation mode, the dynamic circuit comprising a dynamic node and a pull down network that implements a set of logic, the pull down network evaluating, when the dynamic circuit is operating in evaluation mode, a set of input to provide a data signal at the dynamic node; and a clock circuit configured to generate the one-shot clock signal that drives the dynamic circuit, wherein the clock circuit receives as input a power-off signal which, when asserted, causes the pull down network to be deactivated, and wherein the clock circuit, in response to the power-off signal being asserted, causes the one-shot clock signal to drive the dynamic circuit into pre-charge mode, thereby causing the dynamic node to be pulled to a pre-charge voltage to ensure that the dynamic node does not float when the pull down network is deactivated.

2. The apparatus of claim 1, wherein a higher level clock signal drives a first clock signal and a second clock signal, wherein the first clock signal and the second clock signal are inputs to the clock circuit, wherein the first clock signal is a delayed and inverted version of the higher level clock signal, and wherein the second clock signal is a delayed version of the higher level clock signal.

3. The apparatus of claim 2, wherein the clock circuit comprises:

an AND gate for performing a logical AND operation on the first clock signal and an inverted version of the power-off signal to produce a combined signal; and a first transistor and a second transistor, the first transistor having a first terminal coupled to a voltage source, a second terminal coupled to receive the second clock signal, and a third terminal, and the second transistor having a fourth terminal coupled to the third terminal of the first transistor, a fifth terminal coupled to receive the combined signal, and a sixth terminal coupled to an output of the clock circuit.

4. The apparatus of claim 3, wherein the clock circuit further comprises:

a third transistor having a seventh terminal coupled to the sixth terminal of the second transistor, an eighth terminal coupled to receive the second clock signal, and a ninth terminal coupled to ground.

5. The apparatus of claim 1, further comprising:

another dynamic circuit driven by another clock signal to operate in either a pre-charge mode or an evaluation mode, wherein the other dynamic circuit is coupled in series with the dynamic circuit such that a data output of the other dynamic circuit is coupled to the pull down network of the dynamic circuit to provide the set of input that is evaluated by the pull down network.

6. The apparatus of claim 5, wherein the other clock signal is a different clock signal than the one-shot clock signal.

7. The apparatus of claim 6, wherein the dynamic circuit is the last of a plurality of dynamic circuits coupled in series.

8. The apparatus of claim 7, further comprising an output flip flop having an input coupled to the dynamic node of the dynamic circuit.

* * * * *